(12) United States Patent
Huber et al.

(10) Patent No.: US 7,268,591 B1
(45) Date of Patent: Sep. 11, 2007

(54) DECODE STRUCTURE WITH PARALLEL ROTATION

(75) Inventors: Jan-Michael Huber, Austin, TX (US); Michael K. Ciraula, Round Rock, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 112 days.

(21) Appl. No.: 11/274,876

(22) Filed: Nov. 15, 2005

(51) Int. Cl.
*G11C 8/00* (2006.01)
*G06F 12/00* (2006.01)

(52) U.S. Cl. ............... 326/105; 365/230.06; 711/220; 711/211

(58) Field of Classification Search ............... 326/105; 365/230.06, 240; 711/211, 219, 220
See application file for complete search history.

(56) References Cited

U.S. PATENT DOCUMENTS 4,935,897 A * 6/1990 Kurihara et al. ....... 365/189.05
6,574,722 B2 * 6/2003 Utsumi ..................... 711/211

* cited by examiner

*Primary Examiner*—Daniel Chang
(74) *Attorney, Agent, or Firm*—Meyertons Hood Kivlin Kowert & Goetzel, P.C.; Erik A Heter

(57) ABSTRACT

A memory subsystem and a method of operating therefor. The memory subsystem includes a memory array having $2^n$ locations. The memory subsystem includes an address decoder and rotation logic each coupled to receive bits of a first address having n address bits. The rotation logic is also coupled to receive m rotation bits indicating a number of locations the first address is to be shifted if the first address falls within a specified range of addresses. The rotation logic and the address decoder are configured to operate in parallel with each other. Address selection logic is coupled to receive a first plurality of outputs from the address decoder and a second plurality of outputs from the rotation logic and is further configured to select a second address based on the first and second pluralities of outputs.

24 Claims, 3 Drawing Sheets

DECODE STRUCTURE WITH PARALLEL ROTATION

BACKGROUND OF THE INVENTION

1. Field of the Invention

This invention relates to computer systems, and more particularly, to address decode circuitry.

2. Description of the Related Art

To access a certain address in a memory array, a set of address signal is applied to address decoding logic associated with the memory array. The address decoder logic may then decode the address signal and allow access to a location in the memory array that corresponds to an address indicated by the state of the various address signals.

For some types of memory arrays, addressing the array is not such a straightforward process as described above. For example, register files in some x86 processors, still bound by the legacy of the x87 instruction set, include a special zone. If an address is received by the address decoder indicates a location within the special zone, the actual address to be accessed may be different from the received address. In other words, the address may be rotated by a specified amount. The number of locations within the special zone that the address is rotated (i.e. shifted) is indicated by a set of rotate signals.

FIG. 1 illustrates one embodiment of such a memory system. The memory array includes 64 separate locations, and thus requires 6 address bits. These address bits are conveyed to a rotation logic unit. Locations 24-31 of the array comprise a special zone, and thus any address received by the rotation logic unit that falls within this special zone may be rotated. In addition to receiving the address, the rotation logic may receive signals indicating a rotation value, i.e. a number of locations in which the address is to be shifted. It should be noted that the addresses are rotated in a circular fashion, and thus if a rotation value causes an address to be rotated beyond one extreme of the special zone (e.g. location 31) then the next location to which the address is shifted is the other extreme (location 24). For example, if the address received is location 30, and the address is to be rotated right by 3 locations, the address is actually shifted to location 25 (30 to 31, 31 to 24, and 24 to 25).

After the rotation logic has determined if an address is to be shifted and by how many locations if so, it may output a modified address. If after checking the address and determining that it falls outside of the special zone, the rotation logic may output the originally received address. Address output by the rotation logic, whether modified or not, is then received by the address decode logic. The address decode logic then decodes the address and accesses the memory at the appropriate location.

The operation shown herein is performed in a serial manner, and thus is subject to a delay. This delay may adversely impact the speed at which the memory system operates. In certain embodiments (e.g., wherein the memory array is a register file in a processor), the performance impact may be significant, and may thus cause a bottleneck.

SUMMARY OF THE INVENTION

A memory subsystem and a method of operating therefor is disclosed. In one embodiment, the memory subsystem includes a memory array having $2^n$ locations. The memory subsystem includes an address decoder and rotation logic each coupled to receive a first address having n address bits. The rotation logic may be coupled to only receive a subset of the n address bits, while the address decoder may be coupled to receive the full complement of the n address bits. The rotation logic is also coupled to receive m rotation bits indicating a number of locations the first address is to be shifted if the first address falls within a specified range of addresses. The rotation logic and the address decoder are configured to operate in parallel with each other. Address selection logic is coupled to receive a first plurality of outputs from the address decoder and a second plurality of outputs from the rotation logic and is further configured to select a second address based on the first and second pluralities of outputs.

In one embodiment, the address decoder determines whether the first address falls within the specified range of addresses. The rotation logic, based on one or more of the n address bits and the m rotation bits, determines a starting address and a shift distance, thereby determining a rotated address if the first address falls within the specified range. If the first address falls within the specified range, the second address is the rotated address. If the first address does not fall within the specified range, the first and second addresses are equivalent.

A method for operating the memory subsystem includes conveying a first address of having n address bits to an address decoder and a rotation logic unit and conveying m rotation bits to the rotation logic unit. The method further includes determining whether the first address falls within a specified range of addresses and, in parallel, determining a number of locations the first address is to be shifted if the first address falls within the specified range of addresses. Based on these operations, first and second pluralities of outputs are provided, and the second address (which may be a rotated version of the first address if the first address is within the specified range) is determined.

BRIEF DESCRIPTION OF THE DRAWINGS

Other aspects of the invention will become apparent upon reading the following detailed description and upon reference to the accompanying drawings in which.

Figure 1:
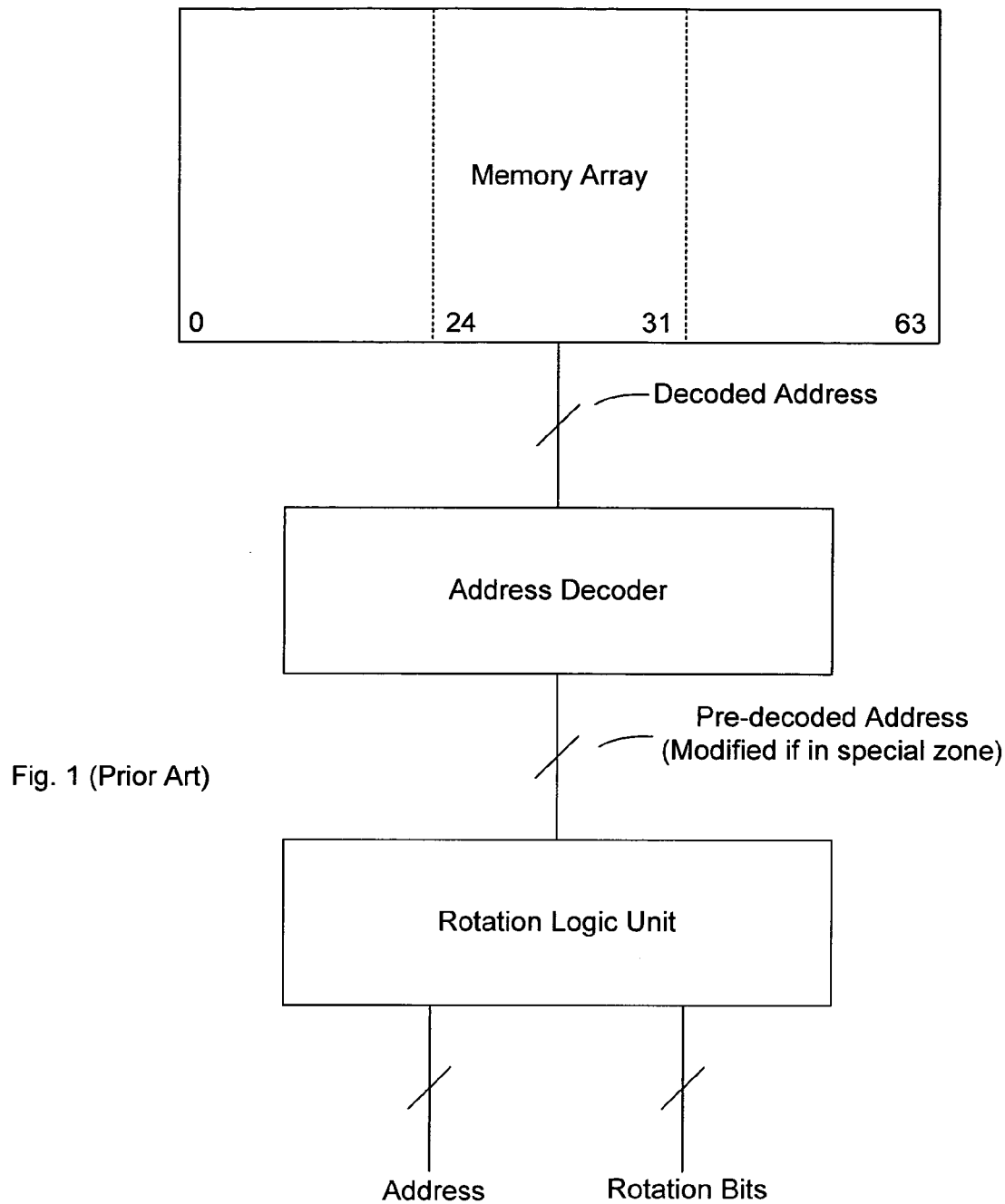
FIG. 1 (Prior Art) is a diagram of one embodiment of a memory array having both address decoding and rotation logic.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
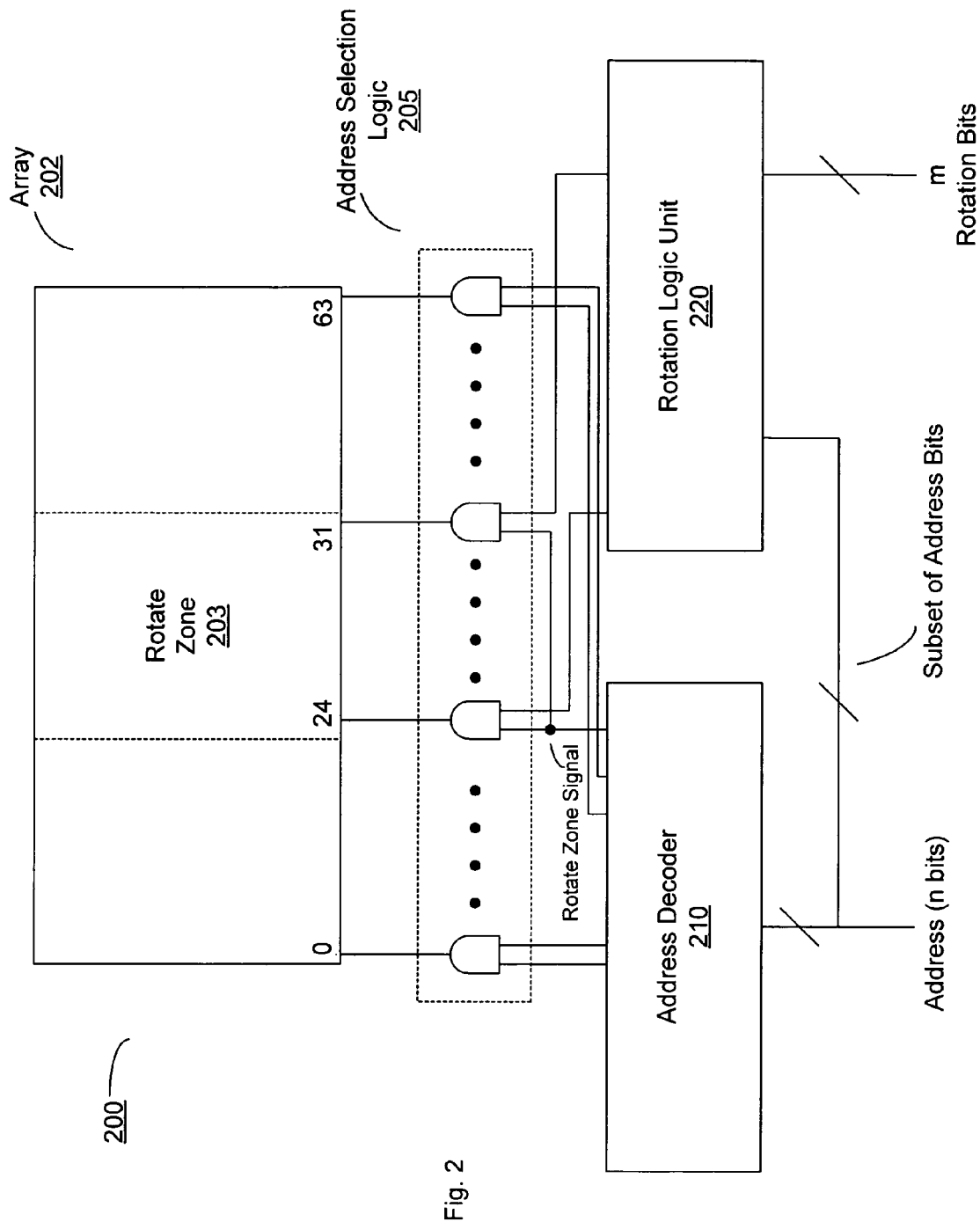
FIG. 2 is a diagram of one embodiment of a embodiment of a memory array wherein the address decoder and the rotation logic operate in parallel.

Turning now to FIG. 2, one embodiment of a memory subsystem is shown. In the embodiment shown, memory subsystem 200 includes a memory array 202, address selection logic 205, address decoder 210, and rotation logic 220.

Address decoder 210 and rotation logic 220 are configured to operate in parallel with each other.

Memory array 202 in this embodiment has 64 addressable locations. Each of the locations may be configured to store a plurality of bits. Memory array 202 also includes a specified range of addresses, shown here as rotate zone 203. In this particular embodiment, rotate zone 203 includes eight different addresses, although embodiments with larger or smaller rotate zones are possible and contemplated. Similarly, embodiments utilizing larger or smaller memory arrays are also possible and contemplated.

In one embodiment, the memory array may be a register file in a processor where an instruction set requires rotation of addresses falling within the specified range. As will be discussed in further detail below, an address received by memory subsystem 200 that falls within the range of addresses covering rotate zone 203 may be shifted. This shifting may also be referred to as being rotated.

Memory subsystem 200 is coupled to receive an n-bit address. In this particular embodiment, the address is 6 bits in length, corresponding to the 64 locations in the memory array (i.e. $2^6=64$). The address (which is referred to hereafter as the first address) is received by both an address decoder 210. In this embodiment, rotation logic unit 220 may receive a subset of the address bits. In one embodiment, rotation logic 220 may be coupled to receive only the three least significant address bits since rotate zone 203 includes only eight locations. By processing only a portion of the address bits, the amount of logic circuitry required by rotations logic unit 220 may be reduced in comparison with the amount of logic required by address decoder 210. The number of connections provided to and from rotation logic unit 220 may also be significantly reduced by utilizing only a subset of the total of the n address bits.

Rotation logic 220 is also coupled to receive m rotation bits. In the embodiment shown, the number of rotation bits corresponds to the number of addressable locations within rotate zone 203. In this particular embodiment, there are eight locations in rotate zone 203, and thus m=3 ($2^3=8$). In one embodiment, the number of address bits received by the rotation logic unit 220 may include only the least significant m bits of the address. Thus, as discussed in the example in the previous paragraph, one embodiment of the memory subsystem 200 may be configured such that rotation logic unit 220 receives m rotation bits and the least significant m bits of the n-bit address, since there are $2^m$ locations in rotate zone 203.

Address decoder 210 is configured to provide a first plurality of output signals to address selection logic 205. Similarly, address selection logic 205 is coupled to receive a second plurality of output signals from rotation logic 220. In the embodiment shown, address selection logic 205 includes a plurality of multi-input AND gates. Each of the AND gates is associated with one of the locations in memory array 202. At any given time, only one of the AND gates is active, and thus address selection logic behaves as a one-hot multiplexer. Each of the AND gates of address selection logic 205 is coupled to receive one or more of the first plurality of output signal provided by address decoder 210. Additionally, each AND gate associated with an address in rotate zone 203 is coupled to receive one of the output signals from rotation logic 205.

One of the output signals asserted by address decoder 210 is a rotate zone signal. This rotate zone signal indicates that the address provided corresponds to a location in rotate zone 203. The rotate zone signal is provided to each of the AND gates associated with one of the address locations within rotate zone 203.

An output of one of the AND gates of address selection logic 205 is asserted for each access to memory array 205. The particular AND gate whose output is asserted depends on the address received by the address decoder and may additionally depend on the m rotation bits if the first address corresponds to a location within rotate zone 203. Address decoder 210 receives and decodes the first address and provides the first plurality of output signals to address selection logic 205. If the first address falls outside of the specified range of addresses, a second address is selected. For the purposes of this disclosure, the second address is used to refer to the address which is ultimately selected for access. Selecting the second address when the first address falls outside of rotate zone 203 in this particular embodiment includes asserting the output of one of the AND gates associated with an address not within rotate zone 203. As such, when the first address falls outside of rotate zone 203, the second address is equivalent to the first address, and thus no rotation is performed.

If the first address falls within rotation zone 203, a rotation operation may be performed based on the value of each of the m rotation bits. As previously noted, rotation logic 220 is coupled to receive both a subset of the n address bits and m rotation bits. Based on the received address bits and the rotation bits, rotation logic 220 is configured to determine what the second address will be if the first address falls within rotate zone 203. Depending on this determination, rotation logic 220 is configured to assert a signal on one of its outputs, while the remainder of its output signals remain de-asserted. The asserted output signal is then provided to the AND gate corresponding to the second address determined by rotation logic 220. The asserted output signal from rotation logic 220, combined with the rotate zone signal received from address decoder 210, will cause a signal to be asserted on its output, thereby selecting the location of memory array corresponding to the second address.

If the first address does indeed fall within rotate zone 203, the output of the AND gate selected may correspond to an address that has been rotated. It should be noted that, even if the first address falls within the rotation zone, no rotation operation occurs if each of the m rotation bits is a '0'. However, if the m rotation bits have a non-zero value, the second address is produced by rotating the first address. For example, if the value of the m rotation bits in this particular implementation is 011 (i.e. decimal equivalent 3), and the address is corresponds to location 24, the first address is shifted to location 27 to produce the second address. If the m rotation bits have this same value, but the address corresponds to location 30, the address is shifted to location 25, since the second address will be in rotate zone 203 whenever the first address also falls within this zone.

In some embodiments, the actual direction of the shift is not important. This is due to the fact that the rotation logic may operate on the m rotation bits as a 2's complement number. Those skilled in the art will appreciate that using 2's complement, each bit of the m bits would be inverted followed by the addition of a logic 1 to the result of this inversion. Thus, shifting the address to the right by 1 location would have the same effect as shifting it to the left by 7 locations (i.e. m=001, m_bar=110, 2's complement result=111). Similarly, shifting the address to the right by 2 locations has the same effect as shifting the address to the left by 5 locations using this 2's complement scheme, and so forth. Thus, operating on the m rotation bits as a 2's complement number has both the effect of shifting the address the proper number of locations as well as ensuring that the rotated address stays within rotate zone 203 (and thus is a circular rotation operation).

Figure 3:
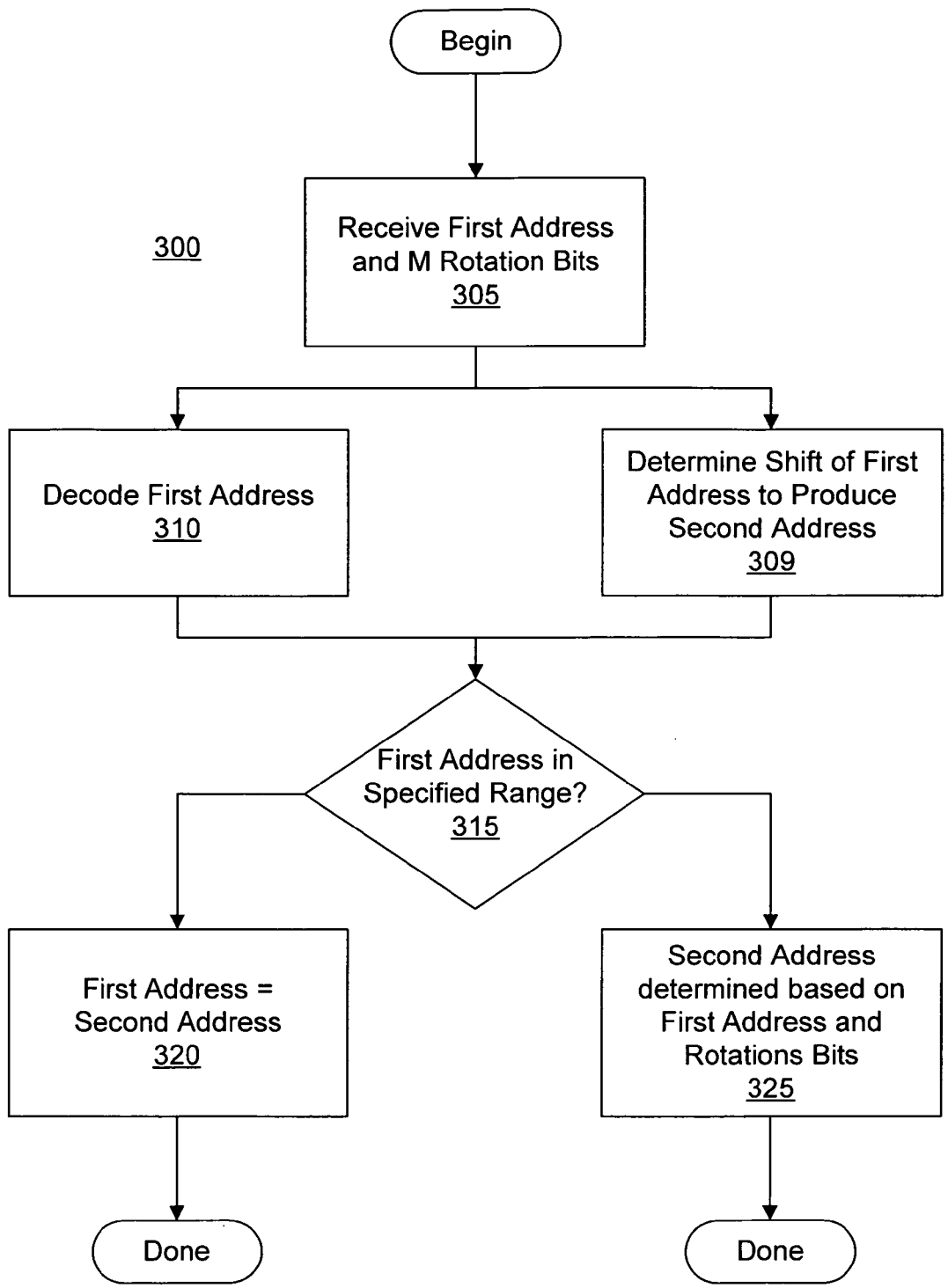
FIG. 3 is a flow diagram of one embodiment of a method for determining a second address based on a first address and a rotation value.

FIG. 3 is a flow diagram of one embodiment of a method for determining a second address based on a first address and a rotation value. Method 200 begins with the conveying of a first n-bit address to a memory subsystem having both an address decoder and a rotation logic unit (305). A plurality of m rotation bits are also conveyed to the rotation logic unit. Each of the n address bits may be received by the address decoder, while the rotation logic may be coupled to receive only a subset of the n address bits. In one embodiment, the subset of address bits received by the rotation logic may include the least significant m bits of the n-bit address. After the address and rotation bits have been received, the first address is decoded by the address decoder (310) while the rotation logic unit determines a possible shifted second address (309). These two operations are performed in parallel. Performing these operations in parallel rather than serially may allow for faster access times to the memory array being addressed.

Decoding the first address in the address decoder includes determining whether the address falls into a specified range of addresses, e.g., rotate zone 203 as discussed above. Meanwhile, the rotation logic unit, based on some or all of the received address bits, as well as the rotation bits, determines the number of positions (if any) that the first address should be shifted to produce a second address should the first address fall within the specified range.

After the decoding is completed, the address decoder outputs a plurality of output signals, which may be in an asserted or de-asserted state. Similarly, the rotation logic unit, based on the received address and rotation bits, also outputs a plurality of output signals. In the embodiment shown in FIG. 2, only one of the output signals provided by the rotation unit is asserted while the remainder of the output signals are de-asserted.

After the determination is made as to whether the first address falls within the specified range (315), a second address is produced. If the first address falls outside of the specified range (315, Yes) then the second address is equivalent to the first address. As a result appropriate address selection logic is activated (i.e. its output asserted) based on the output signals provided by the address decoder. If the first address falls within the specified range, the second address will also fall within the specified range and may be different from the first address. As noted above, the rotation logic unit will assert one of its output signals based on the received first address and the m rotation bits, while de-asserting its remaining output signals. This asserted output signal, combined with one or more received outputs from the address decoder, will cause address selection logic to select the address indicated by the rotation logic. If the m rotation bits have a non-zero value (i.e. one or more of the m bits is a logic 1), this address (the second address) will be different from the received (first address).

In effect, if the first address falls outside of the specified range, the second address is determined only by the address decoder (320), and is equivalent to the first address. If the first address falls within the specified range, the rotation logic effectively determines the second address (325) based on the received address bits and the m rotation bits. In the latter case, the second address may be different from the first address if the rotation bits indicate a shift.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory subsystem system comprising:
a memory array having $2^n$ locations;
an address decoder coupled to receive n address bits indicating a first address of the memory array corresponding to one of the $2^n$ locations, wherein the address decoder is configured to provide a first plurality of output based on the n address bits;
rotation logic coupled to receive at least a subset of the n address bits and m rotation bits, and wherein the m rotation bits indicate a number of locations the first address is to be shifted if the first address falls within a specified range of addresses, wherein the rotation logic is configured to provide a second plurality of outputs based on one or more of n address bits and the m rotation bits, and wherein the rotation logic is configured to operate in parallel with the address decoder; and
address selection logic, wherein the address selection logic is coupled to receive the first plurality of outputs from the address decoder and the second plurality of outputs from the rotation logic, wherein the address selection circuit is configured to select a second address in the memory array based on the first and second pluralities of outputs.

2. The memory subsystem as recited in claim 1, wherein the address selection logic includes $2^n$ logic gates, wherein each of the $2^n$ logic gates is associated with one of the locations in the memory array.

3. The memory subsystem as recited in claim 2, wherein each of the $2^n$ logic gates is coupled to receive certain ones of the first plurality of outputs, and wherein each of a subset of the $2^n$ logic gates is configured to receive one of the second plurality of outputs, wherein each of the subset of the $2^n$ logic gates is associated with an address in the specified range of addresses.

4. The memory subsystem as recited in claim 3, wherein the address selection logic is configured to cause an output of one of the $2^n$ logic gates to be asserted based on the second address, wherein asserting the output of the one of the $2^n$ logic gates selects a location in the memory array when the first address falls outside of the specified range of addresses.

5. The memory subsystem as recited in claim 3, wherein one of the second plurality of outputs is asserted based on the first address and the m rotation bits, and wherein an output of one of the $2^n$ logic gates corresponding to an address in the specified range of addresses is asserted if the first address falls within the specified range.

6. The memory subsystem as recited in claim 2, wherein each of the $2^n$ logic gates is an AND gate.

7. The memory subsystem as recited in claim 1, wherein the subset of n address bits received by the rotation logic includes the least significant m bits of the address.

8. The memory subsystem as recited in claim 1, wherein the specified range of addresses includes $2^m$ locations each corresponding to an address.

9. The memory subsystem as recited in claim 1, wherein the rotation logic unit is configured to determine a starting address and a rotated address based on the m rotation bits and one or more of the n address bits, wherein the rotated address is the second address if the first address falls within the specified range of addresses.

10. The memory subsystem as recited in claim 9, wherein the second address is within the specified range of addresses.

11. The memory subsystem as recited in claim 1, wherein the second address is equivalent to the first address if the first address falls outside the specified range.

12. The memory subsystem as recited in claim 1, wherein the rotation logic is configured to cause the first address to be rotated in a circular rotation operation if the first address falls within the specified range of addresses, wherein the second address is selected based on the circular rotation operation.

13. The memory subsystem as recited in claim 1, wherein the memory array is a register file.

14. The memory subsystem as recited in claim 1, wherein n=6 and m=3.

15. A method comprising:
    conveying a first address to a memory subsystem having an address decoder and a rotation logic unit, the first address having n address bits, wherein said conveying the first address includes providing each of the n address bits to the address decoder and at least a subset of the n address bits to the rotation logic;
    conveying m rotation bits to the rotation logic unit;
    decoding the first address in the address decoder, wherein said decoding includes determining whether the first address falls within a specified range of addresses;
    determining a number of locations the first address is to be shifted, if the first address falls within the specified range, based on one or more of the n address bits and the m rotation bits, wherein said decoding and said determining are performed in parallel;
    providing a first plurality of outputs based on said decoding;
    providing a second plurality of outputs based on said determining the number of locations; and
    selecting a second address based the first and second pluralities of outputs.

16. The method as recited in claim 15, wherein, if the first address falls within the specified range, the first address is rotated by a number of locations indicated by the m rotation bits, wherein the second address is produced based on rotating the first address.

17. The method as recited in claim 15, wherein the second address is equivalent to the first address if the first address falls outside of the specified range.

18. The method as recited in claim 15, wherein a memory array coupled to receive the second address includes $2^n$ locations.

19. The method as recited in claim 18, wherein each of a plurality of AND gates is coupled to receive one or more of the first plurality of outputs, wherein each of the plurality of AND gates is associated with one of the plurality of locations in the memory array.

20. The method as recited in claim 19, wherein a each of a subset of the plurality of AND gates is coupled to receive one of the second plurality of outputs, wherein each of the subset of the plurality of AND gates is associated with an address within the specified range.

21. The method as recited in claim 20, wherein one of the second plurality of outputs is asserted based on the first address and the m rotation bits, and wherein an output of one of the $2^n$ logic gates corresponding to an address in the specified range of addresses is asserted if the first address falls within the specified range.

22. The method as recited in claim 15, wherein the subset of n address bits received by the rotation logic includes the least significant m bits of the address.

23. The method as recited in claim 15, wherein the specified range of addresses includes $2^m$ locations each corresponding to an address.

24. The method as recited in claim 15, wherein m=3 and n=6.

* * * * *